US007478011B2

(12) United States Patent
Gebara et al.

(10) Patent No.: US 7,478,011 B2
(45) Date of Patent: Jan. 13, 2009

(54) METHOD AND SYSTEM FOR MEASURING SIGNAL CHARACTERISTICS OF DATA SIGNALS TRANSMITTED BETWEEN INTEGRATED CIRCUIT CHIPS

(75) Inventors: Fadi H. Gebara, Austin, TX (US); Jeremy D. Schaub, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 11/612,546

(22) Filed: Dec. 19, 2006

(65) Prior Publication Data

US 2008/0147340 A1  Jun. 19, 2008

(51) Int. Cl.
*G04F 10/00* (2006.01)
*G06F 15/00* (2006.01)

(52) U.S. Cl. .................. 702/176; 702/57; 702/177; 702/178; 365/233.5

(58) Field of Classification Search ......... 702/176–179, 702/46, 57, 60, 67, 70, 183–186, 66, 69–74, 702/79, 80, 117, 118, 124–126, 189, 187; 365/233.1, 233.5, 233.11, 233.12, 236; 713/500, 713/502, 600, 375, 400; 324/765; 327/291, 327/299; 714/744

See application file for complete search history.

(56) References Cited

U.S. PATENT DOCUMENTS 6,661,836 B1 * 12/2003 Dalal et al. ................. 375/226

7,061,294 B1 * 6/2006 Talledo et al. ............... 327/291

OTHER PUBLICATIONS

Firmware Measurement Algorithms for the HP 83480 Digital Communications Analyzer, Dec. 1996 Hewlett-Packard Journal.*
Larsson P. et al., "Measuring High-Bandwidth Signals in CMOS Circuits," Electronics Letters, 1993.
Ho, R. et al., "Applications of On-Chip Samplers for Test and Measurement of Integrated Circuits," VLSI 1998.
Takamiya, et al., "An On-Chip 100GHz-Sampling Rate 8 Channel Sampling Oscilloscope With Embedded Sampling Clock Generator," ISSCC 2002.
U.S. Appl. No. 11/427,831, filed on Jun. 30, 2006.
U.S. Appl. No. 11/279,651, filed on Apr. 13, 2006.
U.S. Appl. No. 11/427,940, filed on Jun. 30, 2006.
U.S. Appl. No. 11/427,860, filed Jun. 30, 2006.
Hart et al., "Firmware Measurement Algorithms for HP 83480 Digital Communication Analyzer," Hewlett-Packard Journal (Dec. 1966), pp. 1-9.
Hart et al, "Firmware Measurement Algorithms for HP 83480 Digital Communication Analyzer", Hewlett-Packard Journal (1996), pp. 1-9.

* cited by examiner

*Primary Examiner*—Eliseo Ramos Feliciano
*Assistant Examiner*—Phuong Huynh
(74) *Attorney, Agent, or Firm*—Casimer K. Salys; Winstead, P.C.

(57) ABSTRACT

Data signals received in an integrated circuit are coupled to a receiver and to an on-chip data acquisition system which takes measurement samples of the data signal in response to a measurement request. The measurement request is synchronized with an asynchronous sample clock signal generating a capture signal and a counter reset signal. A counter measures the number of sample clock cycles between measurement requests. On receipt of a measurement request, the capture signal triggers the storage, as capture data, the preset number of cycles in the counter and the measurement samples in a register. The counter is synchronously reset and the capture data is sent to off-chip storage.

22 Claims, 13 Drawing Sheets

METHOD AND SYSTEM FOR MEASURING SIGNAL CHARACTERISTICS OF DATA SIGNALS TRANSMITTED BETWEEN INTEGRATED CIRCUIT CHIPS

CROSS REFERENCE TO RELATED APPLICATION

The present invention is related to the following U.S. patent application which is incorporated by reference:

Ser. No. 11/427,860 filed Jun. 30, 2006 and entitled "Method And Apparatus for Constructing a Synchronous Signal Diagram From Asynchronously Sampled Data".

TECHNICAL FIELD

The present invention relates in general to board level transmission line drivers and receivers, and in particular, to methods of testing data channels transmitting data between integrated circuits driving transmission lines coupling elements on circuit boards.

BACKGROUND INFORMATION

Digital computer systems have a history of continually increasing the speed of the processors used in the system. As computer systems have migrated towards multiprocessor systems, sharing information between processors and memory systems has also generated a requirement for increased speed for the off-chip communication networks. Designers usually have more control over on-chip communication paths than for off-chip communication paths. Off-chip communication paths are longer, have higher noise, impedance mismatches, and have more discontinuities than on-chip communication paths. Since off-chip communication paths are of lower impedance, they require more current and thus more power to drive.

When using inter-chip high-speed signaling, noise and coupling between signal lines (crosstalk) affects signal quality. One way to alleviate the detrimental effects of noise and coupling is through the use of differential signaling. Differential signaling comprises sending a signal and its complement to a differential receiver. In this manner, noise and coupling affect both the signal and the complement equally. The differential receiver only senses the difference between the signal and its complement as the noise and coupling represent common mode signals. Therefore, differential signaling is resistant to the effects that noise and crosstalk have on signal quality.

When high speed data is transmitted between chips, the signal lines are characterized by their transmission line parameters. High speed signals are subject to reflections if the transmission lines are not terminated in an impedance that matches the transmission line characteristic impedance. Reflections may propagate back and forth between driver and receiver and reduce the margins when detecting signals at the receiver. Some form of termination is therefore usually required for all high-speed signals to control overshoot, undershoot, and increase signal quality. For differential signaling, parallel transmission lines are used. Each transmission line may be terminated with respect to their individual characteristic impedance or the differential pair may be terminated with a resistance between the two transmission lines equal to the differential line impedance.

Transmission line systems are characterized by noise, propagation speed, losses, and reflections due to imperfect terminations. Therefore, received signals do not transition between logic levels in a repeatable fashion. Even when triggered to transition to a logic level at the same clock time, line drivers may not do so exactly the same every time. These variations in timing and voltage levels may be viewed by using an oscilloscope system to view a received signal in a time window. A snapshot of the signal during this time window may be displayed by triggering the oscilloscope system to start the time sweep at a clock time synchronous with the clock that generated the data signal. The resulting logic state transitions of the data signal will appear as an "eye diagram" wherein the rise and fall times and the logic one and logic zero voltage levels will be "smeared" to an extent depending on their variability with respect to the triggering clock transitions and any variability in the measuring system.

There is no "one" eye diagram for a data transmission system as the resulting display will depend on how the clock trigger signal at the receiver was derived. Some examples of possible trigger signals are the following:

1) a clock signal trigger at the same rate and synchronous with the data signal.
2) a divided clock trigger signals at some divide ratio of the data rate often related to a power of 2, e.g., 4, 16, etc.
3) a pattern trigger which is a signal that provides a trigger once per pattern repetition.
4) the data itself may be used as a trigger.
5) lastly, the trigger signal is derived by using clock recovery on the data signal.

Each of these methods provide different results when used to construct the eye pattern. The clock trigger in 1) provides a classical eye diagram containing all possible bit transitions in one display. The divided clock trigger in 2) also produces an eye diagram, and this may be useful when the instrument being used to generated the eye diagram has a trigger input bandwidth lower than the data rate of the signal being viewed. This method will produce a good eye diagram unless the pattern length of the data signal divided by the divide ratio is an integer. In this cases the trigger signal will coincide with the same bits in the pattern each time while consistently missing other parts of the pattern. This will lead to an incomplete eye diagram.

The pattern trigger in 3) is used to display individual bits in the data pattern. If the pattern is long and the view time encompasses only a few bit transitions, then a particular group of bits will be viewed each triggered sweep. To view the entire pattern, requires that the view time trigger be delayed from the pattern trigger. This is done using the scope time base and may lead to increased apparent jitter on the displayed signal due to weaknesses in the time base circuitry.

Triggering on the data in 4) is the least desirable method of constructing the eye diagram and should only be used as a quick look-see. Long runs of identical characters provide no transitions to trigger from and so a complete eye diagram is almost impossible to achieve.

Triggering on a recovered clock in 5) while entailing increased complexity does have some advantages as listed:

Works well when the actual clock signal is not available

In cases when the distance between transmitter and receiver is very long, the relationship between the received data and transmit clock may be corrupted Some standards require analysis of the eye diagram as "seen" by the receiver, especially for jitter testing Circuits that are used for clock recovery typically have a loop bandwidth that removes jitter from the recovered clock signal that is present on the data signal. Depending on the measurements to be made this affect may be good or bad and needs to be understood.

Narrow loop bandwidth in clock recovery gives a stable clock as the reference and any jitter in the data eye diagram will be displayed. This is a useful absolute measure but might not properly represent the jitter "seen" by a real system if the receiver also uses clock recovery to track the data to remove jitter.

Wide loop bandwidth lets through more of the jitter in the recovered clock signal. This results in the recovered clock tracking the jitter in the data signal so that the resulting eye diagram may have very little jitter present. Conversely, if there is delay between the data signal and the trigger signal, then the delayed recovered clock trigger may be moving in opposite direction from the data signal resulting in the eye diagram showing twice as much jitter as was present on the data signal.

While these various ways of generating a trigger signal result in variable eye diagrams, most measurement standards specify what type of trigger scheme is required to make particular measurements.

While eye diagrams provide accessible and intuitive view of parametric performance, data systems are ultimately judged on their ability to transmit data with low error rates. Error testing will provide an overall measure of how well a system is performing but does little to help in understanding the underlying causes for lower that expected performance.

A perfect eye diagram would show all parametric aspects of all possible bit sequences no matter how infrequent some effects may occur. This would result in a "high information depth." However, eye diagrams are typically composed of voltage/time samples of the original data that are acquired at some sample rate that may be orders of magnitude slower that the actual data rate. For sampling oscilloscopes, this may be $10^5$ samples per second for a 10 Gb/s (digital pattern 1010) rate. This means that the eye diagrams so acquired would be "information shallow."

This becomes a problem when issues arise that occur infrequently. For example, these may be pattern related, noise related, or may be related to other effects such as crosstalk and other forms of interference. These conditions may not present themselves on a sampled oscilloscope eye pattern but may operate to prevent a transmission link from achieving desired performance levels. For example, a transmission link may be required to have better than one error in $10^{12}$ while the acquired eye diagrams struggle to show events with probabilities below an occurrence rate of 1 in $10^5$.

Eye diagrams provide useful information about characteristics of transmitted data signals and a variety of techniques have been developed to generate and analyze eye diagram data. Integrated circuits (ICs) have I/O speeds that make it desirable to use the techniques without having to interface the signals under test over long distances to a tester. It is obviously desirable to acquire the voltage/time data on-chip and then reconstruct the eye-diagram without the limitations of a display oscilloscope.

Modern computer systems can have hundreds of communication channels per die, making it impractical to view the eye diagram of each individual channel using external test equipment. One solution might be to incorporate components used in a traditional sampling oscilloscope (i.e., trigger, delay line and sampler) near the termination or sample latch of each receiver. However, distribution of a high speed synchronous trigger signal across hundreds of channels is impractical. If the system clock or a locally recovered clock is used, then a variable delay line is required for each sampler. In modern CMOS processes, it is exceptionally difficult to realize a delay line with both fine resolution (i.e., less than an inverter delay—a few picoseconds) and with a large delay range (hundreds of picoseconds). Delay lines often have poor accuracy, high power dissipation and large area, making them impractical for use on a per-channel bases.

In addition, the frequency of the system clock is often dithered slightly to avoid radiation at a particular frequency. In synchronous links, the system clock is common so the frequency deviation is tracked across all communication links. In asynchronous systems, a clock and data recovery block is used on a per channel basis to track the frequency offset of any incoming data signal. Thus the solutions for measuring the eye diagram must have the ability to overcome frequency drift.

Multiple methods have been developed that allow measurements of signal characteristics using asynchronous sampling, on-chip storage of the voltage/time samples and readout of the sampled data for off-chip reconstruction of signal statistics and analysis. These methods all have FIFO memory blocks that allow the capture of relatively large signal data sets (e.g., >4000 samples). These memory blocks become significant when these on-chip measurement techniques are used with wide bus channels.

There is, therefore, a need for a method for making high quality measurements of high speed signals on-chip using circuitry that reduces the area required for the on-chip memory of prior art systems.

SUMMARY OF THE INVENTION

An on-chip signal measurement system comprises one or more digitizing blocks, a counter, a storage register, and a synchronization block. The digitizing block(s) incorporate circuitry that is configured to acquire digital data representative of the analog amplitude of a received signal under test. The counter acquires a count of how many cycles of the asynchronous clock have occurred since the last measurement samples was acquired. The storage register captures the current state of the counter, and digitizing block(s) in response to a measurement request signal. The synchronization block receives the measurement request signal and generates a measurement signal synchronous with the sample clock signal that captures the current state data in the register and a reset signal synchronous with the sample clock signal for resetting the counter. The register data is sent off-chip for processing and storage. When a desired number of samples are acquired, signal statistics may be generated and analyzed.

The off-chip processing generates a new time base for the acquired data using a time base algorithm modified to incorporate the counter values. The time base allows various signal characteristics to be generated. The method of the present invention retains all the benefits of previous asynchronous sampling methods while drastically reducing the area required for implementation. As a result the amount of data analyzed is no longer limited by the size of on-chip data acquisition memory.

In one embodiment, a first digitizing block acquires a signal that is synchronous with the data clock. A second digitizing block acquires a signal that may be non-periodic with respect to the data clock. In this embodiment, the first digitizing block is used to find the asynchronous sample rate using the time base algorithm, then the sample rate is used to analyze the signal data from the second digitizing block.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
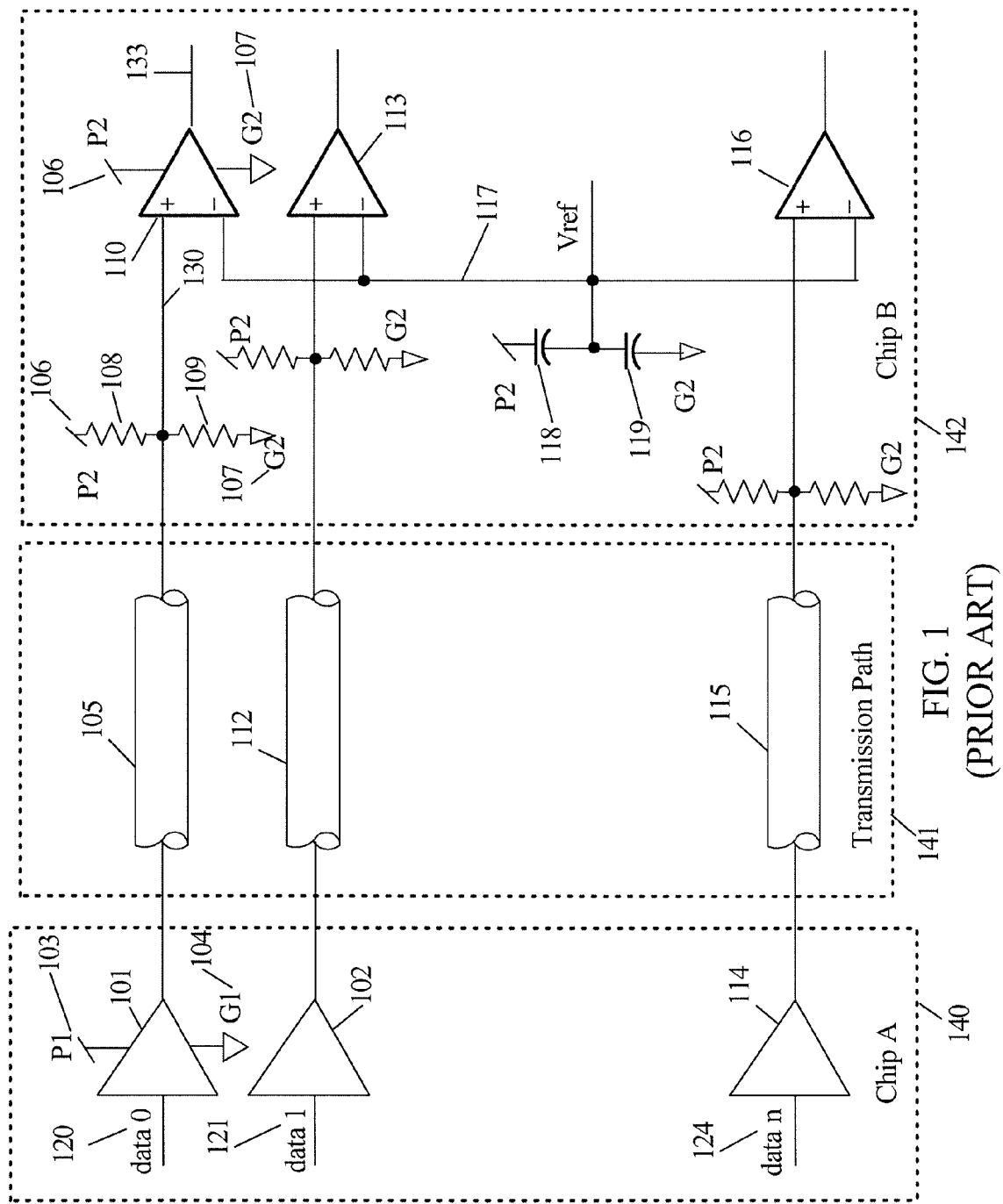
FIG. 1 is a prior art circuit diagram of data channels using pseudo differential signaling.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

An explanation of how timing jitter of a eye pattern used in embodiments of the present invention may be determined is found in the publication: "Firmware Measurement Algorithms for HP 83480 Digital Communications Analyzer", Hewlett-Packard Journal, 1996, which is hereby incorporated by reference herein.

The following description discusses analyzing "data signals." It is understood that the "data signals" is a broad term used to describe signals that convey data in their logic states or data in their frequency, timing, or analog amplitude. Thus, the term "data signals" may refer to signals for conveying data and clock type signals that may be used primarily to convey timing.

Refer now to the drawings wherein depicted elements are not necessarily shown to scale and wherein like or similar elements are designated by the same reference numeral through the several views.

FIG. 1 is a circuit diagram of typical pseudo-differential signaling for transmitting data from drivers in a Chip A 140 to receivers in a Chip B 142 via a transmission path 141. Drivers 101, 102 and 114 represent three of a number of n drivers sending data to receivers 110, 113 and 116, respectively. Exemplary drivers 110, 113 and 116 receive data 0 120, data 1 121 and data n 124 and generates an output that swings between power supply rail voltages P1 103 (logic one) and G1 104 (logic zero). When the output of an exemplary driver 101 is at P1 103, any noise on the power bus is coupled to transmission line 105 along with the logic state of the data signal. Exemplary transmission lines 105, 112 and 115 are terminated with a voltage divider (e.g., exemplary resistors 108 and 109). Receiver input 130 to receiver 110 has a DC bias value determined by the voltage division ratio of resistors 108 and 109 and the voltage between P2 106 and G2 107. Receiver 110 is powered by voltages P2 106 and G2 107 which may have different values from P1 103 and G1 104 due to distribution losses, noise coupling, and dynamic impedance of the distribution network. Exemplary receivers 110, 113 and 116 are typically a voltage comparator or high gain amplifier that amplifies the difference between a signal at input 130 and a reference voltage Vref 117 and generates a detected output (e.g., output 133 of receiver 110). Voltage reference Vref 117 may be programmable and generated by a variety of techniques.

Figure 2:
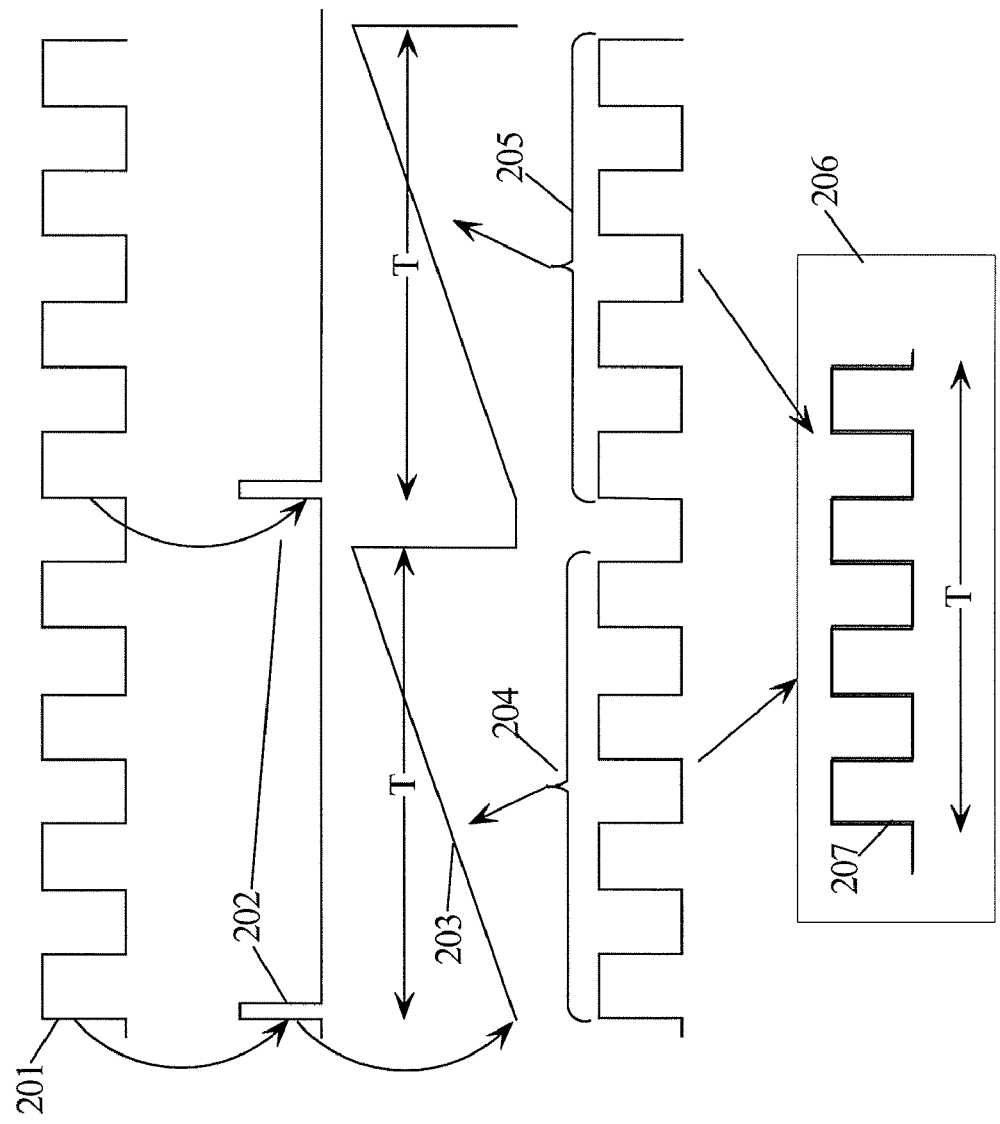
FIG. 2 illustrates waveforms resulting from displaying portions of a signal using a triggering system.

FIG. 2 illustrates waveforms that may be observed when viewing a data clock 201 on an oscilloscope (note shown). Trigger pulses 202 are shown generated on a positive transition of data clock 201. If the display oscilloscope is analog, then a sweep voltage 203 is generated that moves the electron beam of the oscilloscope across the viewing screen 206. If sweep voltage 203 is linear and calibrated, then the beam will transition in a specific time forming a continuous time base scale of the display. The first sweep will display cycles 204 of data clock 201. After the viewing screen sweep is complete, the beam retraces and the next positive transition allows viewing of another portion 205 of data clock 201. Cycles 204 and 205 will be superimposed even though they occur at different real times. This process continues and the voltage levels and timing transitions will experience a widening when displayed depending on the stability of data clock 201 and the stability of the display itself. If the signal being observed is a data signal with logic one and logic zero transitions occurring at particular data clock transitions, then both positive and negative transitions will be observed at the same apparent data clock times. This is the basis for generating an eye diagram used in embodiments of the present invention.

Figure 3:
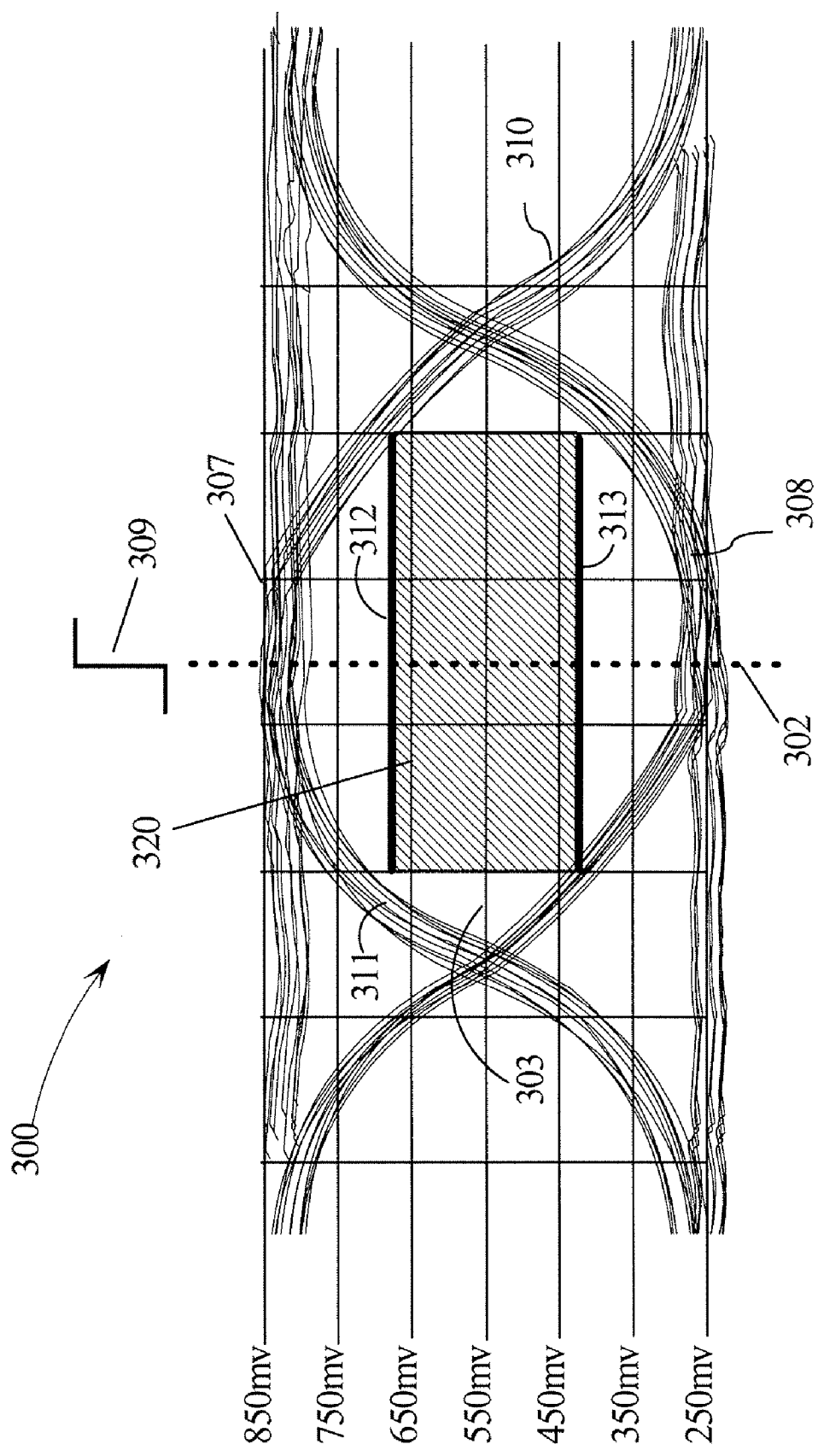
FIG. 3 illustrates characteristics of an eye diagram for analyzing a data channel.

FIG. 3 illustrates an eye diagram of a data signal 300. Various signal characteristics may be monitored in determining what metric to use in setting an optimum value of variables affecting the data signal 300 eye pattern. FIG. 3 illustrates a superposition of traces of an exemplary signal (e.g. 206 in FIG. 2) received over a transmission line (TL) (e.g., 115). FIG. 3 defines what is meant by the "eye window" of a waveform as discussed in embodiments of the present invention. If one displays a data signal generated in response to a data clock, then all of the data transitions will overlap with a tolerance corresponding to timing jitter. A time lapse oscillograph of the data signal show that the waveform transitions between a logic one and a logic zero actually vary (e.g., positive transitions 311 and negative transitions 310). The actual voltage levels corresponding to a logic one (307) and a logic zero (308) also show dynamic variances. The "eye window" is illustrated by 320, wherein the data is considered valid. Voltage level 312 illustrates the voltage above which a received signal is defined as a logic one and level 313 illustrates the voltage below which a received signal is defined as a logic zero. The crossover point 303 (voltage 550 mV) may be an ideal threshold voltage for a receiver. The voltage between 312 and 307 may be called the positive signal-to-noise margin and the voltage between 313 and 308 may be called the negative signal-to-noise margin. Noise margins may be one way to determine an optimum value to use to set a reference voltage (e.g., Vref 307) for detecting a data signal 306 to generate a detected data signal at receiver output 314.

If the data signal 300 was sampled by a clock transition 309, it would be ideal to have the clock transition occur at time 302 where the data window 320 gives the best margins. If the clock 309 sample time 302 moved to the left or right of window 320, then errors may be more frequent. Using this criteria, it can be said that positioning data 300 relative to clock 309 as shown would have maximized the eye pattern window for detecting the logic states of data 300.

Figure 4:
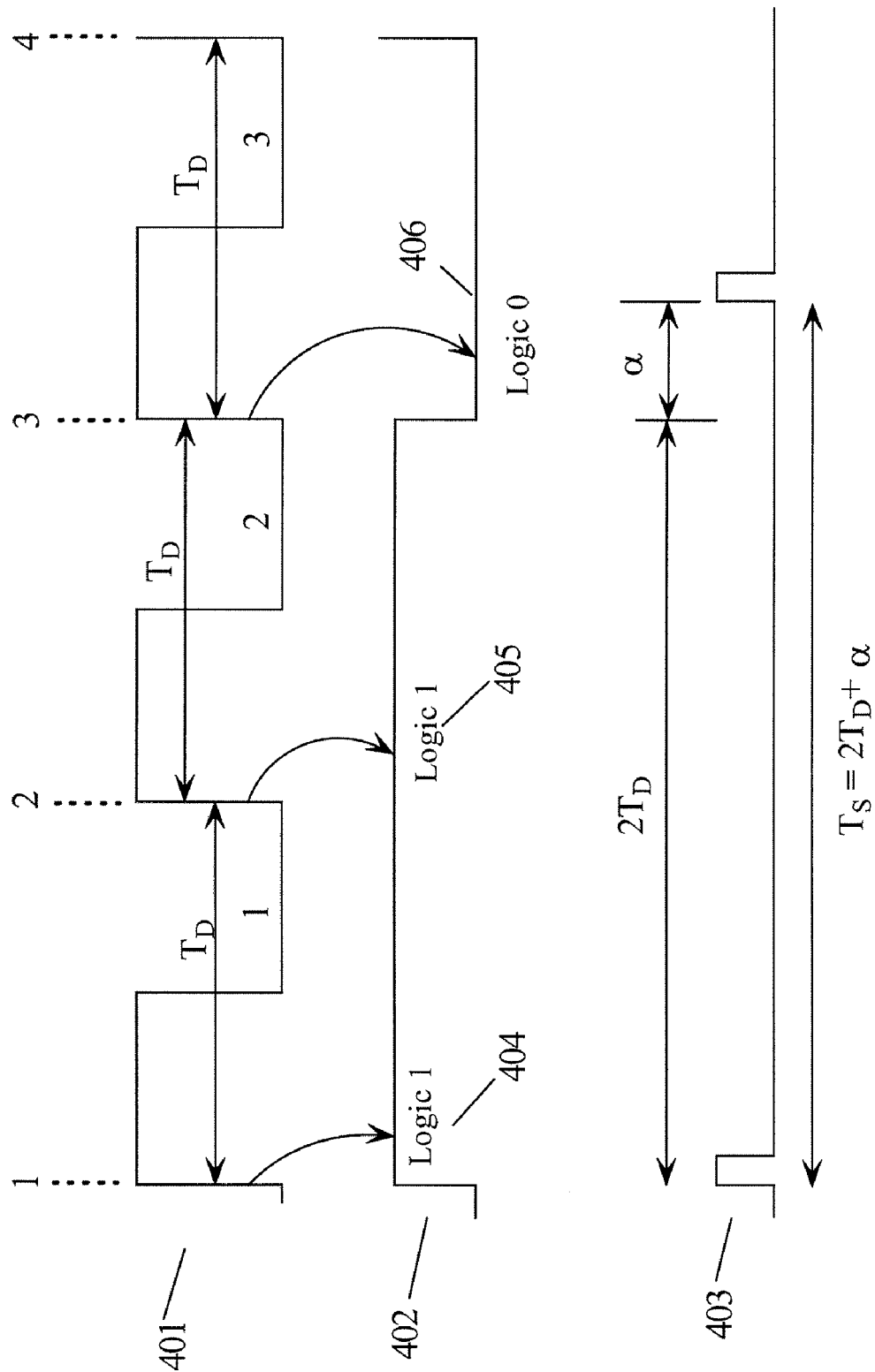
FIG. 4 illustrates waveforms characteristic of a data pattern generated by a data clock and sampled by a corresponding sample clock signal.

FIG. 4 illustrates a data clock 401 with a period represented by time $T_D$. Logic states 404-406 of the data signal 402 are set on each clock edge (1-4). For example, logic state 404 is set on clock edge 1, logic state 405 is set on clock edge 2 and logic state 406 is set on clock edge 3. Assuming a variable data pattern in data signal 402, over time, all transitions (logic 0 to logic 1 and logic 1 to logic zero) will occur at some $N^{th}$ edge of the clock. Data signal 402 is sampled with a sample clock 403 with a period represented by time $T_S$. Sample clock 403, in general, is generated asynchronous with and is not a harmonic of data clock 401. If data signal 402 is sampled with sample clock 403, then sample times may be represented as multiples of the data clock 401 plus a remainder shown as α 407. In FIG. 4, the first sample is shown synchronous with clock edge 1 at time zero (0) to simplify explanation. The sample times may then be shown to be represented by the sequence [S]=0, $T_D$+α, $2T_D$+2α, $3T_D$+3α, ... $KT_D$+Kα. If the sample times are normalized relative to the time $T_D$, then the $[S_N]$=0, 1+α/$T_D$, 2+2α/$T_D$, 3+3α/$T_D$, ... K+Kα/$T_D$. Each element of sequence $[S_N]$ is made up of an integer first term and a fraction last term that is a fraction of the data signal period $T_D$. If the number of samples K is sufficiently large such that there are terms Pα/$T_D$>1, then its integer portion is added to the integer first term. Now by dropping the integer term of each element of sequence $[S_N]$, a new sequence $[S_{N1}]$ is generated where each fraction term Pα/$T_D$<1 represents a point that falls within the time period $T_D$. This technique results in mapping all of the sample points onto the data clock period $T_D$. In this manner, the data signal 402 may be sampled with a sample clock 403 generating a voltage sequence V[N] and a corresponding N element time sequence $[S_{N1}]$ which will map all of the sample points onto one period of the data clock 401 generating an eye diagram for the data signal path.

If the period $T_S$ sample clock 403 was less than the period $T_D$ of data clock 401, then over sampling would result. Taking a series of K samples in this case again results in a sequence [S]=0, $T_D$α, $2T_D$α, $3T_D$α, ... $KT_D$α. Now if the sample times are normalized relative to the time $T_D$, then the $[S_N]$=0, α, 2α, 3α, ... Kα. The first terms of each sequence $[S_N]$ element are fractions of the data signal period $T_D$. If the number of samples K is sufficiently large such that there are terms Pα>1, then the integer portion is added as an integer term. Again, by dropping the integer terms that occur in elements of sequence $[S_N]$, a new sequence $[S_{N1}]$ is generated where each term Pα<1 represents a point that falls within the time period $T_D$.

Figure 5:
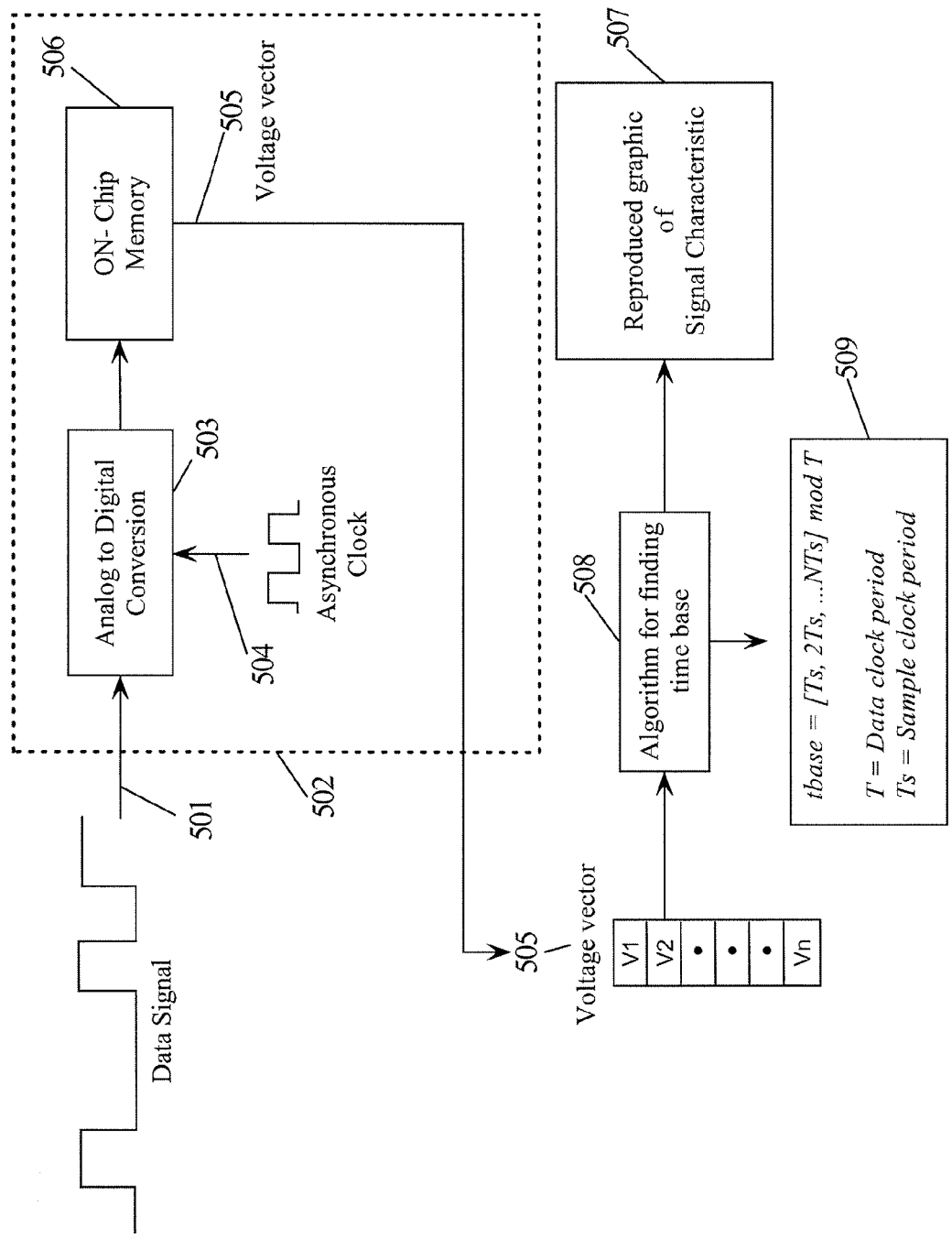
FIG. 5 is a circuit block diagram of a sampling system used in prior art on-chip signal measurement systems.

FIG. 5 is a block diagram of prior art systems for acquiring measurement data on-chip using an asynchronous clock. A data signal 501 is coupled to analog to digital converter (ADC) 503 which acquires samples of data signal 501 on each positive edge of asynchronous clock 504. The sample of the data signal is digitized and the digital sample is stored in on-chip memory 506. When a set of samples has been acquired, a voltage vector 505 comprising a sequence of voltage samples is read out from the chip for processing and analysis. Each of the voltage samples in voltage vector 505 corresponds to a transition of the asynchronous clock 504. Thus, the time base of voltage vector 505 is integer multiples of the sample clock period which is generally unknown. An algorithm is required to generate an effective time base (tbase 509) as modulo T (data clock period) of the sequence formed by the integer multiples of the sample clock. The voltage samples may then be analyzed using tbase 509 to generate signal characteristics or to produce a graphic representing signal quality (e.g., an eye diagram).

Figure 6:
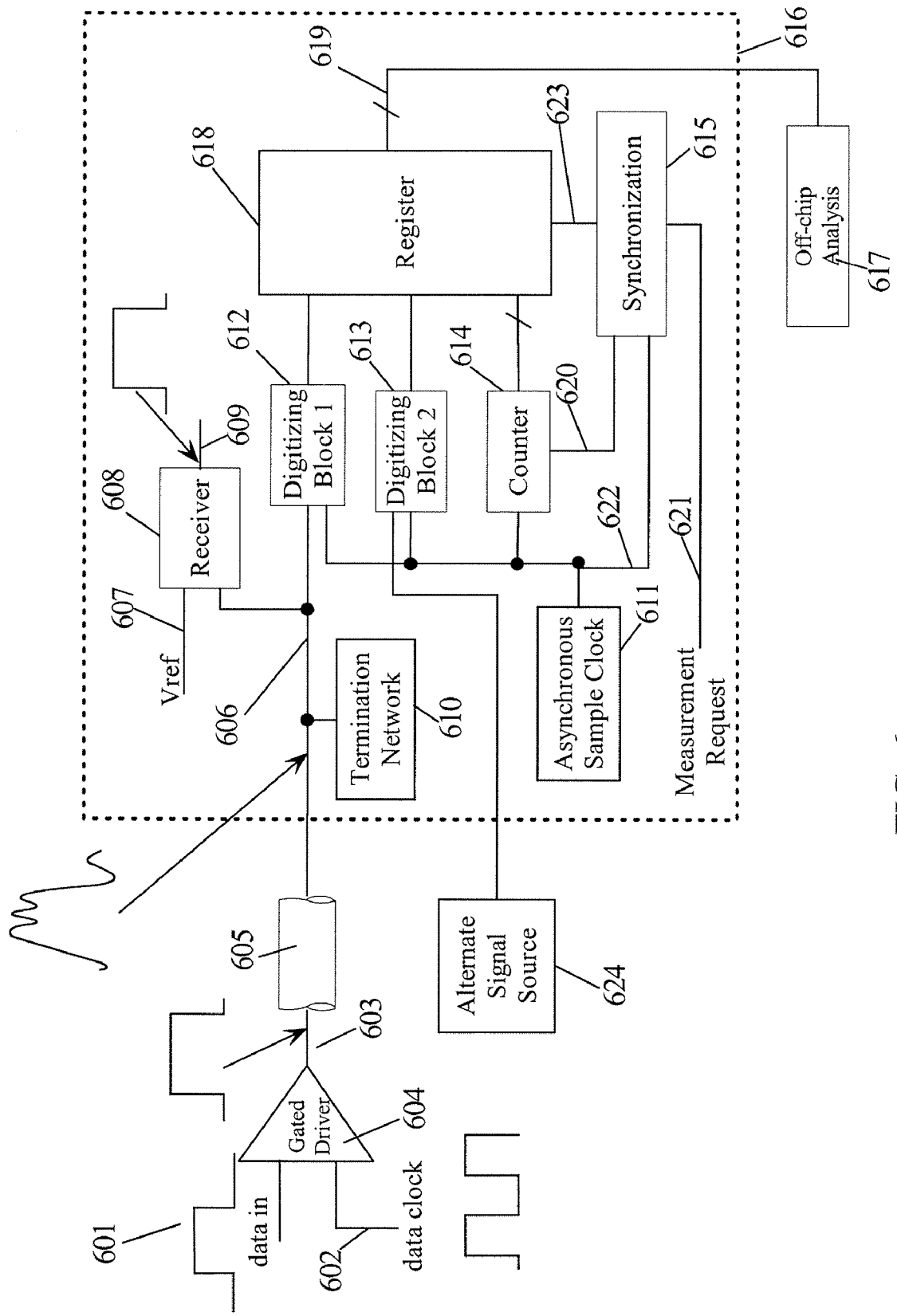
FIG. 6 is a block diagram of an on-chip signal measurement system according to an embodiment of the present invention.

FIG. 6 illustrates an exemplary data channel with on-chip data acquisition and off-chip storage and analysis according to an embodiment of the present invention. In this embodiment, data_in 601 is clocked with data clock 602 to produce data signal 603. Data signal 603 is transmitted over transmission line 615 and arrives distorted as signal 606. Receiver 608 detects signal 606 relative to Vref 607 generating detected data signal 609 which is used for normal data processing. Over time the waveform of data signal 606 manifests amplitude and timing variations indicative of the variability of the data channel. Analysis of these variations in signal characteristics will reveal how much margin is available and how the channel design may be modified to produce more reliable data transmission.

The present invention couples data signal 606 to a digitizing block 1 612 and an optional digitizing block 2 613. Digitizing block 1 612 represents a variety of circuitry that may be employed to convert the analog voltage of data signal 606 to digital data. Likewise, digitizing block 2 613 represents a variety of circuitry that may be employed to digitize alternate signal 624 which may be asynchronous with data clock 602. For example, alternate signal source 624 may be power supply noise or another signal not synchronous with data clock 602. The digital data from digitizing block 1 612 and digitizing block 2 613 are coupled to register 618 which stores the data in response to a transition of a capture signal 623 from synchronization unit 615. Both digitizing block 1 612 and digitizing block 2 613 are clocked with sample clock 611 (asynchronous clock). Counter 614 is reset pulse 620 after each sample captured by register 618 in response to a measurement request 621. Reset pulse 620 and capture signal 623 are synchronized with sample clock 611. After each measurement request 621, the data from digitizing block 1 612 and digitizing block 2 613 as well as the count value of counter 614 are read out to off-chip analyzer 617. In the present invention, the on-chip memory is replaced by counter 614 and register 618 greatly reducing the area required to implement the on-chip data acquisition circuitry.

Figure 7A:
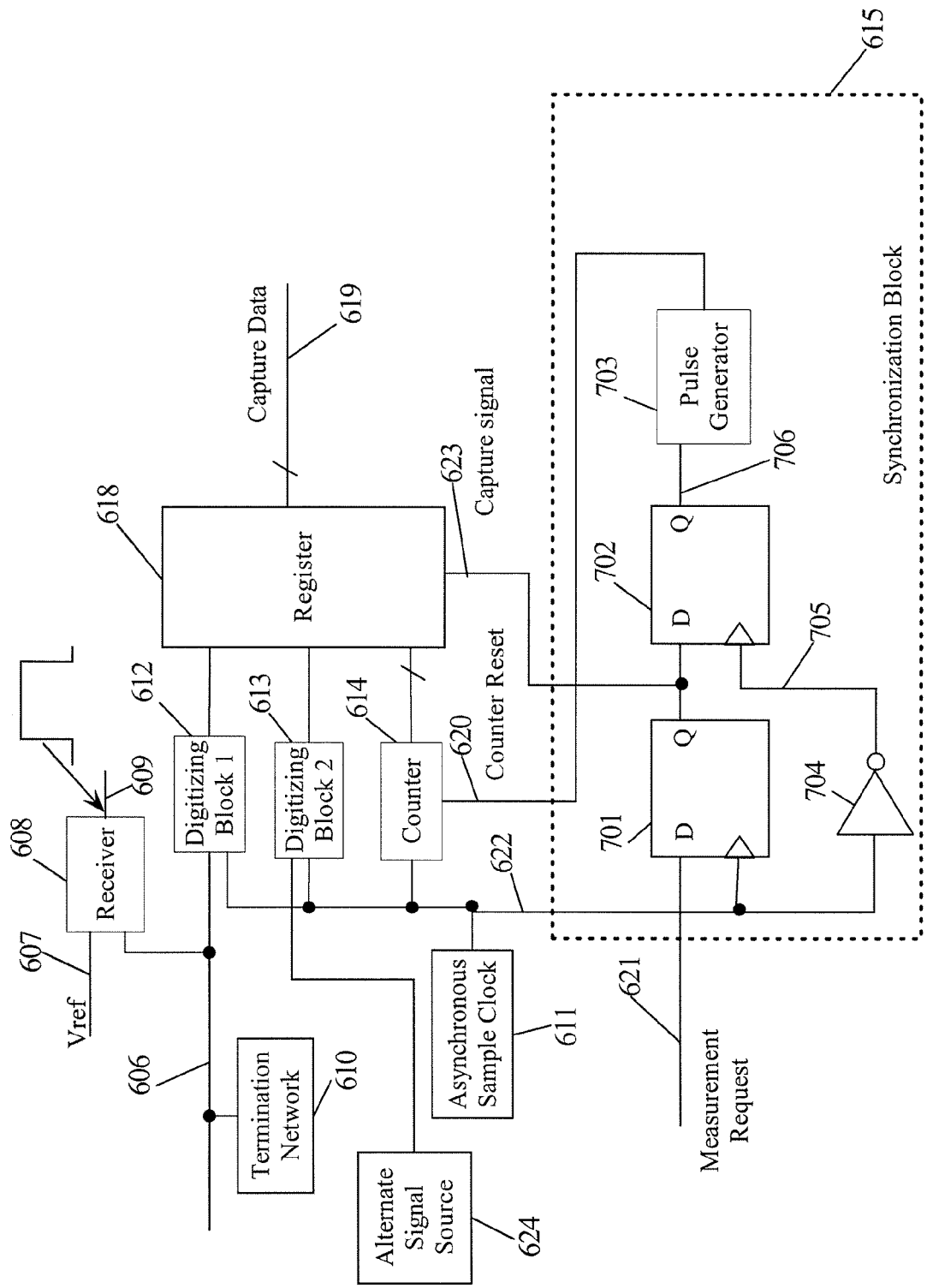
FIG. 7A is the block diagram of FIG. 6 showing details of a synchronization block suitable for use with embodiments of the present invention.

FIG. 7A shows and expanded circuit diagram of circuitry suitable for implementing the synchronization block 615 described in FIG. 6. The circuitry comprising termination network 610 and receiver 608 use Vref 607 to produce an detected signal 609 as described relative to FIG. 6. Likewise asynchronous sample clock 611, digitizing block 1 612, digitizing block 2 613, counter 614 and register 618 operate as described relative to FIG. 6 to produce capture data 619.

Synchronization block 615 receives measurement requests 621 and produces the counter reset pulse 620 and the capture signal 623. D-type flip flop (FF) 701 is clocked by sample clock 611 and D-type FF 702 is clocked by the complement of the sample clock 611 (705) generated by inverter 704. When sample clock 611 is a logic one, the logic state of the measurement request 621 is coupled as capture signal 623. When sample clock 611 transitions to a logic zero the output state of D-FF 701 is latched. Likewise, when sample clock 611 is a logic zero, the logic state of 706 is coupled to pulse generator 703. A transition to a logic one triggers a pulse (counter reset 620) from pulse generator 703 to reset counter 614.

Figure 7B:
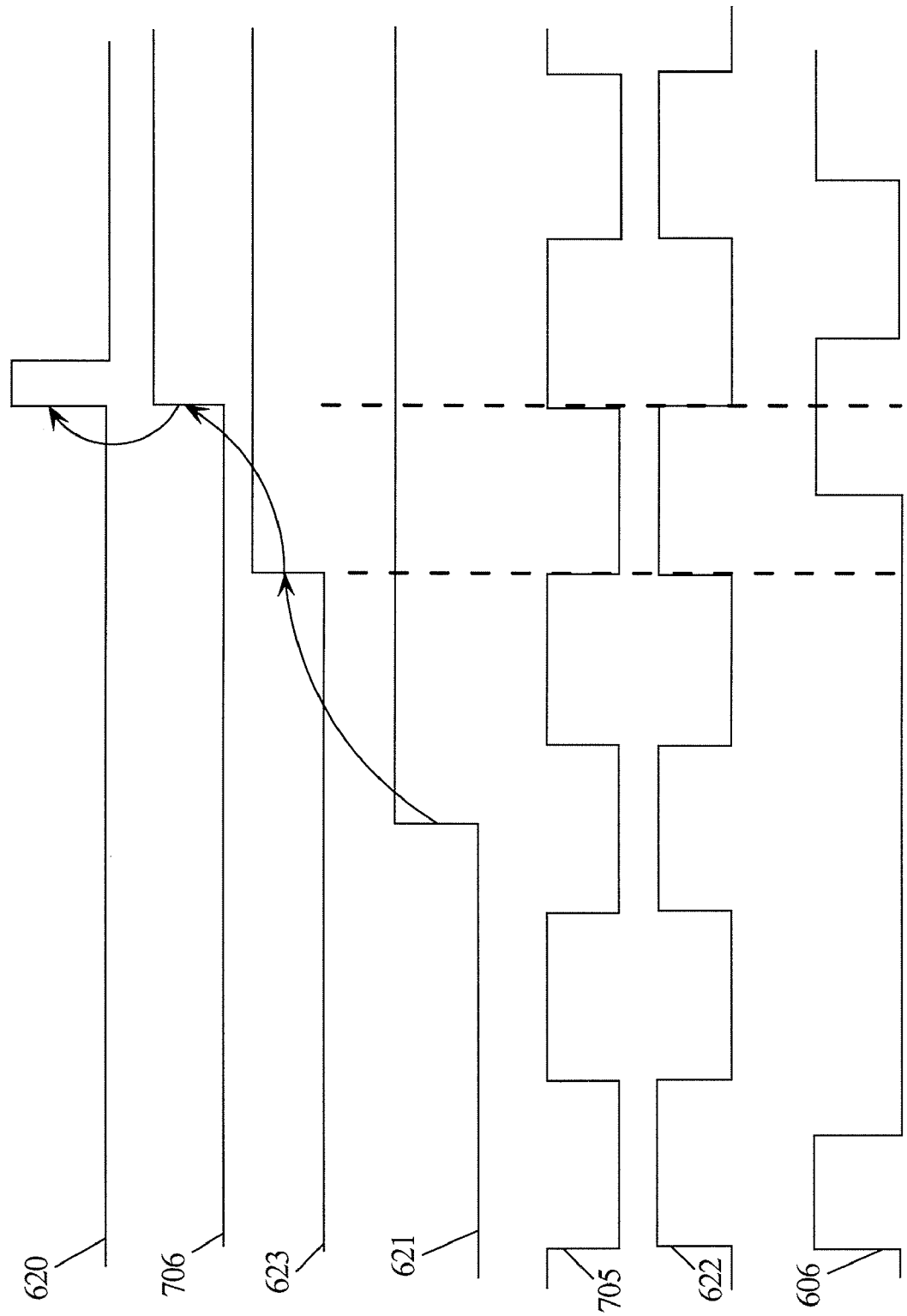
FIG. 7B illustrates the timing of waveforms in the embodiment of FIG. 7A.

FIG. 7B is a timing diagram describing the signals generated by synchronization block 615. Data signal 606 is generally asynchronous with sample clock signal 622. When a measurement is requested, measurement request signal 621 transitions to a logic one. This logic one is transferred to the output as a positive transition on capture signal 623 when sample clock signal 622 transitions to a logic one. Likewise, the logic one is transferred as control signal 706 when complementary sample clock 705 transitions to a logic one. The positive transition on control signal 706 triggers the generation of counter reset pulse 620 by pulse generator 703.

Figure 7C:
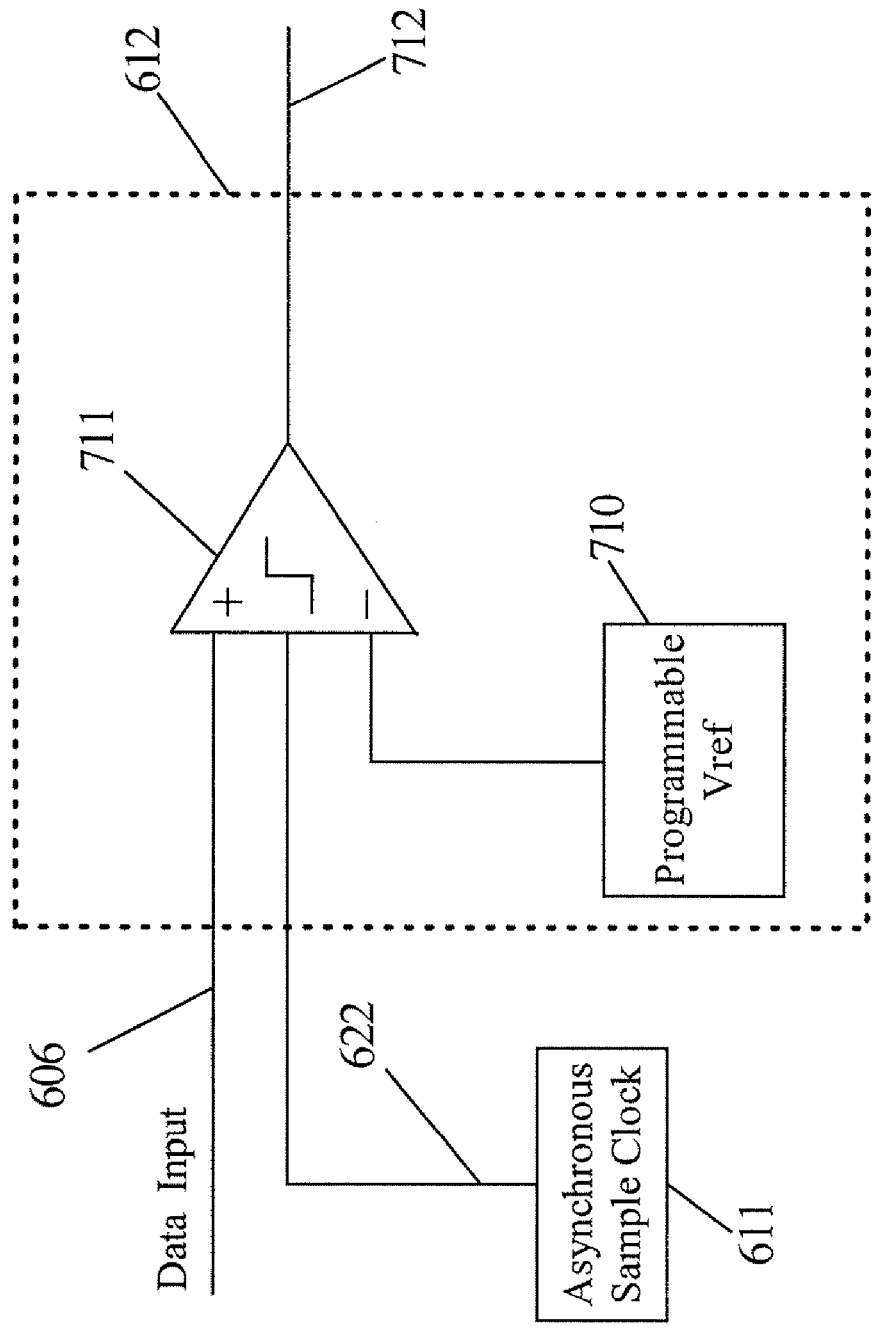
FIG. 7C is the block diagram showing details of a digitization block suitable for use with embodiments of the present invention.

FIG. 7C is a circuit diagram of an exemplary digitizing block 1 612 suitable for practicing an embodiment of the present invention. Comparator 711 receives a programmable reference voltage Vref 710 and sample clock 611 which synchronizes its output. When data input 606 is greater than Vref 710 and sample clock transitions to a logic one, then the output 712 of comparator 711 is a logic one. By scanning the value of Vref 710 (inputting program values), will generate a set of values that determine if data input signal 606 is greater or less than a particular programmed value of Vref 710. In this manner, input signal data 606 may be digitized.

Figure 8:
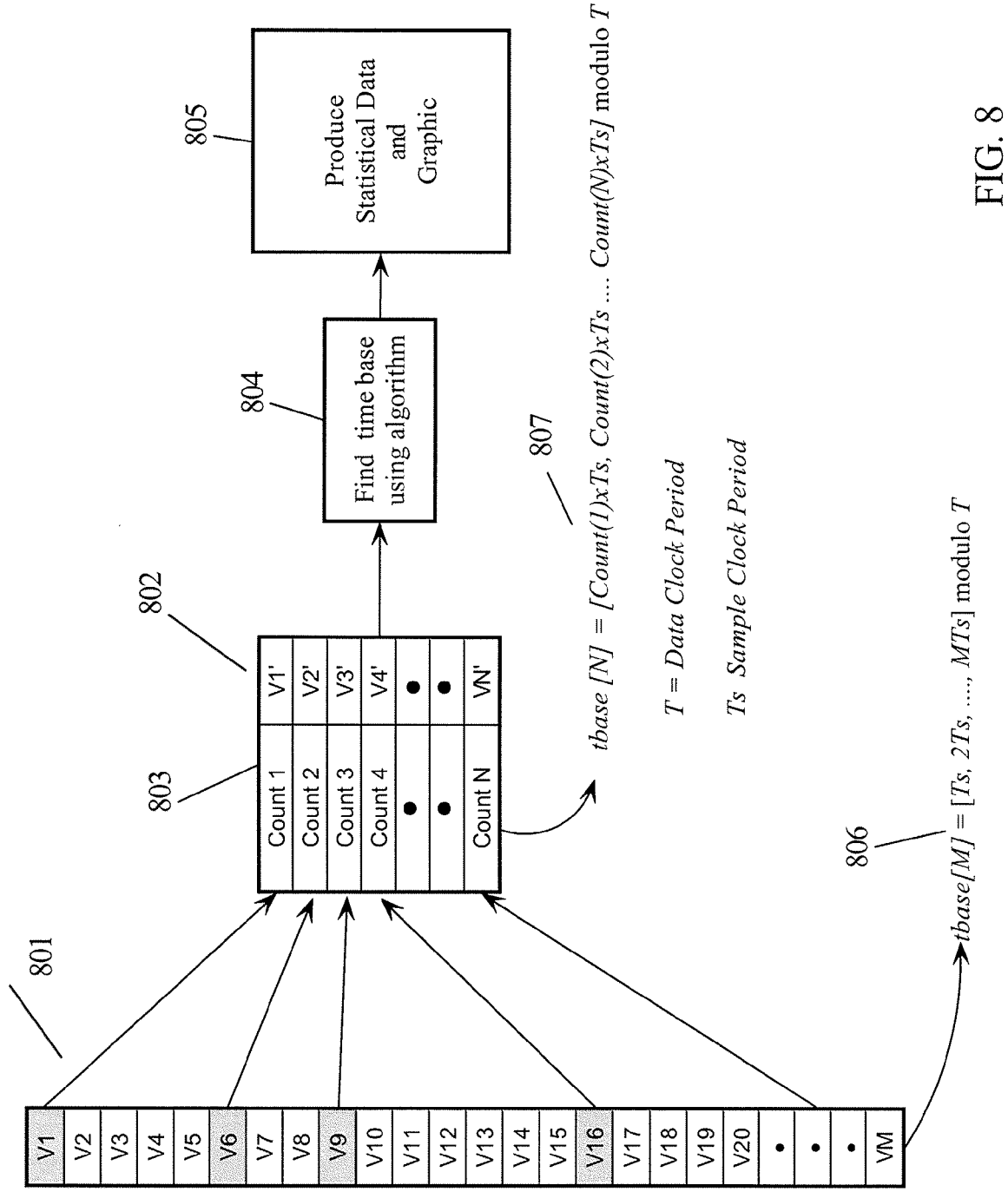
FIG. 8 illustrates the relationship between a voltage vector of prior art systems and a voltage vector according to embodiments of the present invention.

FIG. 8 illustrates how an embodiment of the present invention enables an effective time base to be generated without the need for on-chip memory. The effective time base generated according to embodiments of the present invention allow the same analysis as prior art systems while requiring much less on-chip area. Prior art systems generate an exemplary voltage vector 801 wherein each of the sample points represents one sequential period of the sample clock (e.g., 611). In this example, 20 samples V1-V20 are shown in voltage vector 801. Prior art systems generate an effective time base, tbase 806, as modulo T of the time sequence TS through NTS. In the system of the present invention, samples of the data signal are triggered by a measurement request 621 which are then synchronized with the sample clock 611. Thus, instead of generating all the samples V1-V20, the present invention may generate only exemplary samples V1, V6, V9 and V16 each associated with a value of counter 614 (e.g., Count1-Count 4). In this case, the voltage vector 802 is V1'-VN'.

In the example of FIG. 8, the first measurement request (e.g., 621) would be synchronized with the sample clock (e.g., 611) and the voltage sample V(i) (as V(i)') and a counter value (Count i) would be stored representing the number of cycles of the sample clock 611 since the last measurement request 621. Each time a measurement request is received additional terms in the sequences 803 and 802 are acquired and stored off-chip. At the end of the test, a number N samples will have be acquired and stored off-chip. In the prior art, M samples would have been stored on-chip and the voltage vector would be V[M]=[V1, V2, V3, ... VM] and the corresponding time vector would be tbase[M]=[TS, 2TS, ... MTS] modulo T. According to an embodiment of the present invention, the voltage vector is shown to be a sub-set of V[N] as V[M]=[V1, V6, V9, ... VN] and the corresponding time vector tbase [N]=[(Count 1)TS, (Count 2)TS, ... (Count N)TS]. For the exemplary vector 801 shown, the number of periods of the sample clock corresponding to V1, V6, V9, V16 ... VN] is [0, 5TS, 3TS, 7TS, ... KTS], where the particular value of TS is unknown. To generate the effective time base, tbase [N], from Count [N], an algorithm is exercised that calculates tbase [N]=(Count [N])TS modulo T. A closed form value for this calculation is only possible if TS is known which is not the general case. Thus, an algorithm is exercised wherein TS is estimated and iterated until an effective tbase [N] is calculated and an eye diagram is determined and analyzed for minimum jitter. The effective tbase [N] is chosen using the calculated value of TS that result in the minimum jitter in the eye diagram. The present invention does not require that the voltage samples (capture data) to be taken at consecutive cycles of TS, it is only required that the samples are synchronized with the sample clock signal 622 and represent an integer number of cycles of TS since the last sample.

By acquiring the samples over a longer time period, the requirement for on-chip memory is replaced by the counter 614 and register 618 and the sample size is only limited by the amount of off-chip storage allocated for the measurement analysis system 617.

Sample clock 611, in general, is generated asynchronous with and is not a harmonic of data signal 606. If data signal 606 is sampled and data captured at each measure request 621, a voltage sequence is generated that does not have equal periods of time associated with each voltage value. Relative to FIG. 4, each voltage sample corresponded to time period represented as an integer multiple of the sample clock 403. In the present invention, the time periods of the voltage samples correspond to non-sequential integer multiples of the sample clock 611. Relative to FIG. 8, this produces time sequences represented by the count values of counter 614 (e.g., Count 1-Count N) in time vector 803. In this case, these times (for the 20 sample values shown) would be [0, 5TS, 3TS, and 7TS]. Assuming the same relationship between the sample clock 611 and the data clock generating data signal 606, the sample times may be shown to be represented by the sequence [S]=[0, 5T+5α, 3T+3α, 7T+7α]. If the sample times are normalized relative to the time $T_D$, then the $[S_N]$=[0, 5+5α/T, 3+3α/T, 7+7α/T]. Again, each element of sequence $[S_N]$ is made up of an integer first term and a fraction last term that is a fraction of the data signal period T. If the time between samples is sufficiently large such that there are terms $Pα/T_D$>1, then its integer portion is added to the integer first term. Generating modulo T dropping the integer term of each element of sequence $[S_N]$, a new sequence $[S_{N1}]$ is generated where each fraction term Pα/T<1 represents a point that falls within the time period T. Again, this technique results in mapping all of the sample points onto the data clock period T. In this manner, the data signal 606 may be sampled with a sample clock 611 generating a voltage sequence V[N] and a corresponding N element time sequence $[S_{N1}]$ which will map all of the sample points onto one period of the data clock for generating an eye diagram for the data signal path.

In the prior art, the terms in the sequence represented successive integer multiples of the sample clock 611. In the present invention, the terms in the sequence correspond to the number of sample clock cycles between successive samples. The number of clock cycles between samples does not have to be the same to map of the data points over one period of the data clock. As in the prior art, the requirement is to determine an accurate estimate of the actual sample clock.

Embodiments of the present invention use prior art methods to empirically determine the "effective" period of sample clock 611. After each measurement request, the values captured in register 618 are read out to off-chip analyzer 617. Analyzer 617 employs method steps that determine the "effective" period of the actual sample clock that will generate, within a tolerance, a set of times within the data clock period T that are close to actual time points that correspond to when the sequence of data points were captured. In the present invention, any number of data points may be taken before analysis proceeds because there is no limitation of a fixed on-chip storage available for acquiring data points as was the case in the prior art. The prior art reference cited has details of a suitable method for determining an effective time base for capture data acquired and stored according to the present invention.

Figure 9A:
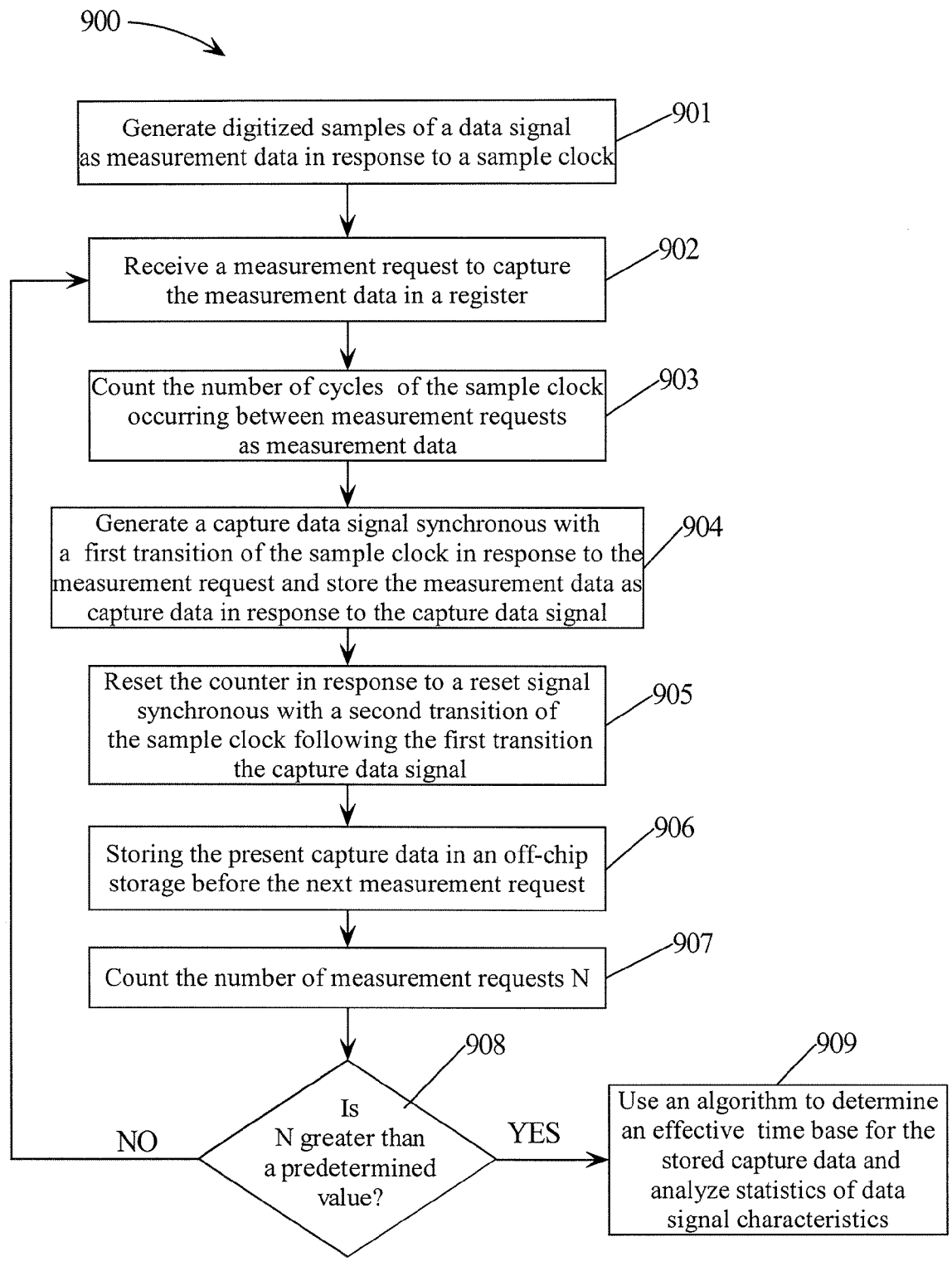
FIG. 9A is a flow diagram of method steps used in embodiments of the present invention.

FIG. 9A is a flow diagram 900 of method steps used in an embodiment of the present invention. In step 901, new digitized samples of a data signal, generated in response to a data clock, a taken as measurement data on a logic state transition of a sample clock signal. In step 902, a measurement request is received to capture the present measurement data in a register. In step 903, a counter counts the number of cycles of the sample clock occurring between measurement requests also as measurement data. In step 904, a capture data signal is generated synchronous with the sample clock in response to the measurement request and the present measurement data is stored as capture data in response to the capture signal. In step 905, a reset signal is generated synchronous with the sample clock following the capture data signal and is used to reset the present state of the counter. In step 906, the present capture data in the register is stored off-chip before the next measurement request. In step 907, the number of measurement requests are counted as a number N. In step 908, a test is made to determine if N is greater than a predetermined value. If the result of the test in step 908 is NO, then a branch is taken back to step 902 to await the next measurement request. If the result of the test in step 908 is YES, then an algorithm is used to determine the effective time base for the capture data stored in the off-chip storage and the effective time base and the store capture data are analyzed to generated statistics of the data signal characteristics.

Figure 9B:
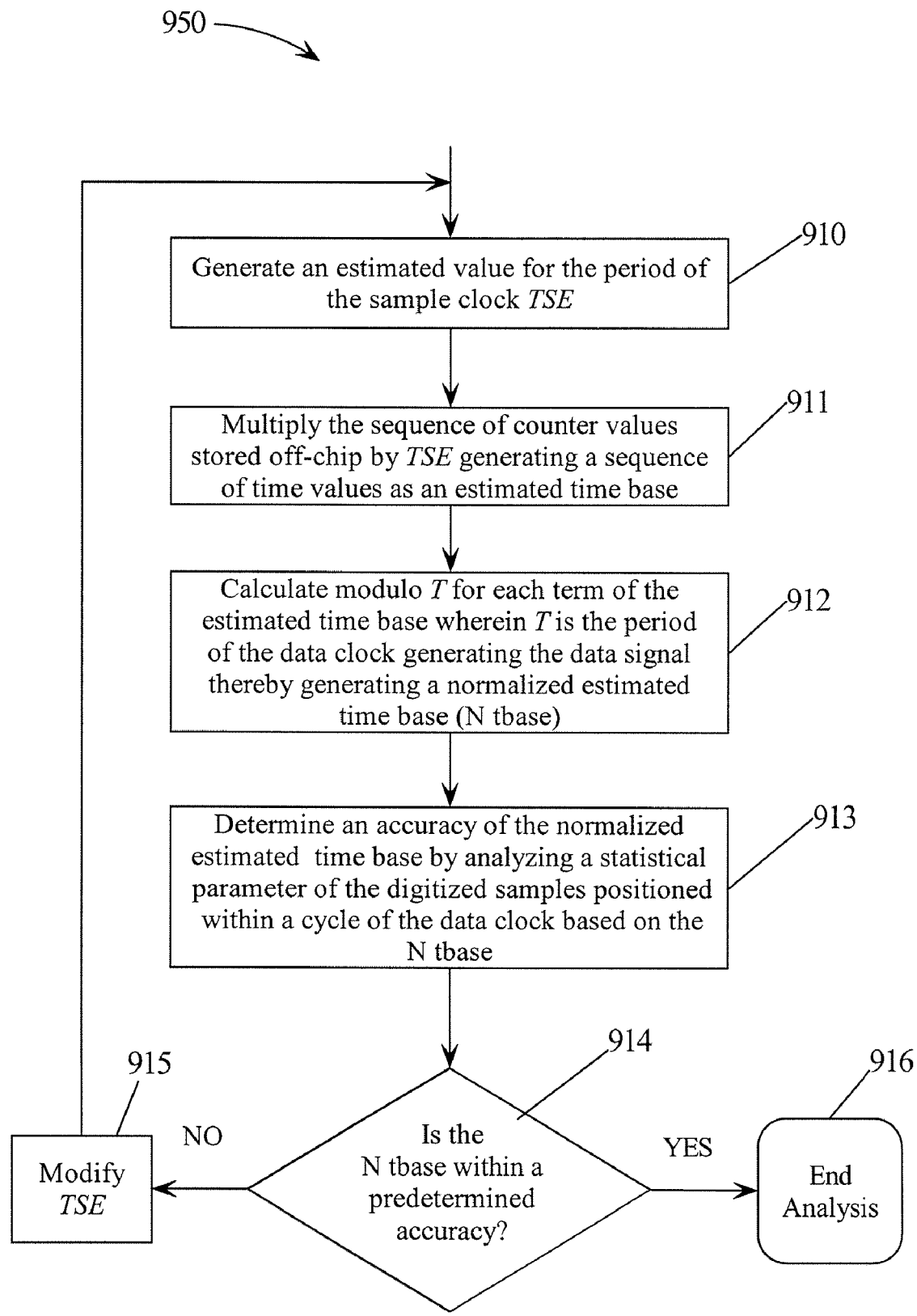
FIG. 9B is a flow diagram of method steps used in embodiments of the present invention.

FIG. 9B is a flow diagram 950 of method steps used in combination with the method of FIG. 9A. In step 910 an estimated value for the period of the sample clock TSE is generated. In step 911, the sequence of counter values stored off-chip are multiplied by TSE thereby generating a sequence of time values as an estimated time base. In step 912, the modulo T value for each term of the estimated time base is calculated generating the normalized estimated time base. In step 913, the accuracy of the estimated time base is determined by analyzing a statistical parameter of the digitized samples positioned within a cycle of the data clock T based on the normalized estimated time base. In step 914, a test is done to determine if the accuracy of the normalized estimated time base is within a predetermined accuracy. If the result of the test in step 914 is NO, then in step 915 the value of TSE is modified and a branch is taken back to step 915. If the result of the test in step 914 is YES, then in step 916 the analysis is ended.

Figure 9C:
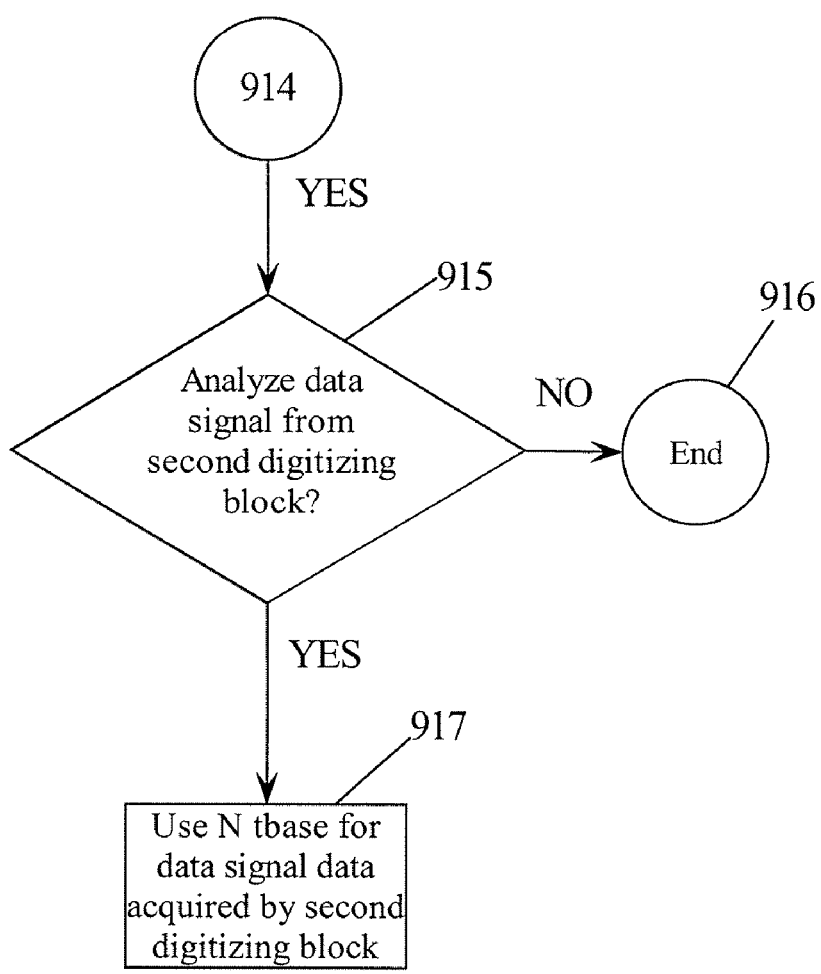
FIG. 9C is a flow diagram of method steps used in an embodiment of the present invention.

FIG. 9C is a flow diagram 960 of method steps used in embodiments of the present invention. Once the normalized time base is determined in FIG. 9B, it may be used to analyze the data acquired relative to optional digitizing block 2 613 used to digitize the alternate signal source 624. Since the same sample clock 622 was used to acquire samples of both data signal 606 and alternate signal source 623, the N tbase 807 may be used for both signal sources. In step 915, a test is done to determine if data from a second digitizing block (e.g., 613), that was not generated in response to data clock (e.g., 602), is to be analyzed. If the result of the test in step 915 is YES, then the normalized time base (N tbase) is used to regenerate the data signal from the alternate signal source (e.g., 624) digitized by the second digitizing block. If the result of the test in step 915 is NO, then the analysis is ended in step 916.

Although the present invention and its advantages have been described in detail, it should be understood that various changes, substitutions and alterations can be made herein without departing from the spirit and scope of the invention as defined by the appended claims.

What is claimed is:

1. A method for measuring characteristics of an on-chip data signal generated in response to a data clock with period T using on-chip data acquisition circuitry with off-chip data storage and analysis comprising the steps of:
   a) counting cycles of an asynchronous sample clock signal in a counter;
   b) generating a digitized sample of the on-chip data signal in response to the asynchronous sample clock signal;
   c) generating a capture signal synchronous with a first transition of the sample clock signal responsive to a measurement request;
   d) capturing the digitized sample of the on-chip data signal and a present count value of the counter in a register in response to the capture signal;
   e) resetting the counter in response to a reset pulse synchronous with a second transition of the sample clock signal following the first transition of the sample clock signal;
   f) storing a present digitized sample of the on-chip data signal and the present counter value of the register in off-chip storage in response to the capture signal; and
   g) repeating steps a) to f) a predetermined number N times.

2. The method of claim 1, wherein the measurement request occurs asynchronous with the sample clock signal.

3. The method of claim 2, wherein the numbers of cycles of the sample clock signal between measurement requests are not uniform.

4. The method of claim 1, further comprising the step of configuring a measurement vector including a sequence of digitized samples stored from the register and a sequence of counter values each associated with a corresponding one of the digitized samples.

5. The method of claim 4, comprising the steps of;
   1) generating an estimated value for a period the sample clock signal (TS);
   2) multiplying the sequence of counter values stored off-chip by the estimated value for the period of the sample clock signal generating a sequence of time values as an estimated time base;
   3) calculating modulo T for each term of the estimated time base;
   4) determining an accuracy of the estimated time base by analyzing a statistical parameter of the digitized samples positioned within a cycle of the data clock based on the estimated time base; and
   5) repeating steps 1) through 4) until the statistical parameter is less than a predetermined minimum value.

6. The method of claim 5, wherein the digitized samples are positioned within a cycle of the data clock based on the estimated time base generated an eye diagram of the on-chip data signal.

7. The method of claim 6, wherein the statistical parameter is a timing jitter of transitions of the eye diagram of the on-chip data signal.

8. A system for determining characteristics of an on-chip data signal generated in response to a data clock with period T and received in a integrated circuit (IC) chip comprising;

digitizing circuitry for generating a digitized sample of the on-chip data signal digitized in response to a first transition of a sample clock signal;

a counter for generating a count of a number of occurrences of a cycle of the sample clock signal occurring between sequential measurement requests received at the IC chip;

a register for capturing a present value of the digitized sample and the count of the counter in response to a capture signal; and synchronization circuitry generating the capture signal in response to one of the measurement requests and a first transition of the sample clock signal following the one of the measurement requests, and generating a counter reset signal in response to the capture signal and a second transition sample clock signal immediately following the first transition of the sample clock signal.

9. The system of claim 8, further comprising an off-chip memory for storing the capture data in response after each measurement request 10. The system of claim 8, wherein the one of the measurement requests occurs asynchronous with the sample clock signal.

11. The system of claim 10, wherein the numbers of cycles of the sample clock signal between measurement requests are not uniform.

12. The system of claim 8, further comprising:
circuitry generating an estimated value for the period the sample clock signal (TS);
circuitry for multiplying the sequence of counter values stored off-chip by the estimated value for the period of the sample clock signal generating a sequence of time values as an estimated time base;
circuitry for calculating modulo T for each term of the estimated time base; and
circuitry for determining an accuracy of the estimated time base by analyzing a statistical parameter of the digitized samples positioned within a cycle of the data clock based on the estimated time base.

13. The system of claim 12, wherein the digitized samples are positioned within a cycle of the data clock based on the estimated time base generated an eye diagram of the on-chip data signal.

14. The system of claim 13, wherein the statistical parameter is a timing jitter of transitions of the eye diagram of the on-chip data signal.

15. A method for measuring characteristics of one or more on-chip data signals at least one generated in response to a data clock with period T using on-chip data acquisition circuitry with off-chip data storage and analysis comprising the steps of:
a) counting cycles of an asynchronous sample clock signal in a counter;
b) generating a digitized sample of the on-chip data signal in response to the asynchronous sample clock signal;
c) generating a capture signal synchronous with a first transition of the sample clock signal responsive to a measurement request;
d) capturing the digitized sample of the on-chip data signal and a present count value of the counter in a register in response to the capture signal;
e) resetting the counter in response to a reset pulse synchronous with a second transition of the sample clock signal following the first transition of the sample clock signal;
f) storing a present digitized sample of the on-chip data signal and the present counter value of the register in off-chip storage in response to the capture signal; and
g) repeating steps a) to f) a predetermined number N times.

16. The method of claim 15, wherein the measurement request occurs asynchronous with the sample clock signal.

17. The method of claim 16, wherein the numbers of cycles of the sample clock signal between measurement requests are not uniform.

18. The method of claim 15, further comprising the step of configuring a measurement vector for each of the one or more on-chip data signals that includes sequences of digitized samples stored from the register and a sequence of counter values each associated with a corresponding one of the digitized samples.

19. The method of claim 18, comprising the steps of;
1) generating an estimated value for the period the sample clock signal (TS);
2) multiplying the sequence of counter values stored off-chip by the estimated value for the period of the sample clock signal generating a sequence of time values as an estimated time base;
3) calculating modulo T for each term of the estimated time base;
4) determining an accuracy of the estimated time base by analyzing a statistical parameter of first digitized samples of the on-chip data signal generated in response to a data clock with period T, wherein the first digitized samples are positioned within a cycle of the data clock based on the estimated time base; and
5) repeating steps 1) through 4) until the statistical parameter is less than a predetermined minimum value.

20. The method of claim 19, wherein the first digitized samples are positioned within a cycle of the data clock based on the estimated time base generated an eye diagram of the on-chip data signal generated in response to a data clock with period T.

21. The method of claim 20, wherein the statistical parameter is a timing jitter of transitions of the eye diagram of the on-chip data signal generated in response to a data clock with period T.

22. The method of claim 19, wherein values of the estimated time base after the statistical parameter is less than a predetermined minimum value are used to regenerate a sampled test on-chip data signal, from the one or more on-chip data signals, that was not generated using the data clock with period T.

* * * * *